(12) United States Patent
Kobamoto

(10) Patent No.: US 9,324,887 B2
(45) Date of Patent: Apr. 26, 2016

(54) SOLAR CELL ELEMENT, SEGMENTED SOLAR CELL ELEMENT, SOLAR CELL MODULE, AND ELECTRONIC APPLIANCE

(75) Inventor: Naoya Kobamoto, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 1158 days.

(21) Appl. No.: 13/266,455

(22) PCT Filed: Apr. 27, 2010

(86) PCT No.: PCT/JP2010/057451
§ 371 (c)(1),
(2), (4) Date: Oct. 26, 2011

(87) PCT Pub. No.: WO2010/126038
PCT Pub. Date: Nov. 4, 2010

(65) Prior Publication Data
US 2012/0048369 A1  Mar. 1, 2012

(30) Foreign Application Priority Data
Apr. 27, 2009  (JP) ................................. 2009-107902

(51) Int. Cl.
*H01L 31/0224* (2006.01)
*H01L 31/048* (2014.01)
*H01L 31/068* (2012.01)

(52) U.S. Cl.
CPC .. *H01L 31/022433* (2013.01); *H01L 31/02245* (2013.01); *H01L 31/048* (2013.01); *H01L 31/068* (2013.01); *Y02E 10/547* (2013.01)

(58) Field of Classification Search
CPC ..................... H01L 31/022433; H01L 31/048; H01L 31/02245; H01L 31/068
See application file for complete search history.

(56) References Cited

U.S. PATENT DOCUMENTS 3,966,499 A * 6/1976 Yasui .............. H01L 31/022433
136/206
4,228,315 A  10/1980 Napoli
(Continued)

FOREIGN PATENT DOCUMENTS

| CN | 101373796 A | 2/2009 |
|----|-------------|--------|
| CN | 101399293 A | 4/2009 |

(Continued)

OTHER PUBLICATIONS

Office Action dated Jul. 22, 2013, issued in counterpart Chinese Application No. 201080018185.9.

(Continued)

*Primary Examiner* — Golam Mowla
(74) *Attorney, Agent, or Firm* — Procopio Cory Hargreaves and Savitch LLP

(57) ABSTRACT

A solar cell element according to an embodiment of the present invention includes a semiconductor substrate that includes a first semiconductor layer of one conductivity type and a second semiconductor layer of the opposite conductivity type, and a plurality of linear current collector electrodes that are arranged on a first main surface of the semiconductor substrate at the second semiconductor layer side, the plurality of linear current collector electrodes being arranged at intervals in a direction from a middle part toward both end parts of the first main surface. A distance between neighboring ones of the current collector electrodes located in the middle part and a distance between neighboring ones of the current collector electrodes located in the both end parts are different from each other.

14 Claims, 10 Drawing Sheets

(56) References Cited

U.S. PATENT DOCUMENTS

| | | | |
|---|---|---|---|
| 6,175,075 B1 * | 1/2001 | Shiotsuka | B32B 17/04 136/244 |
| 6,573,445 B1 | 6/2003 | Burgers | |
| 7,985,610 B2 * | 7/2011 | You | H01L 31/022433 257/E21.065 |
| 8,420,927 B2 * | 4/2013 | Lee | H01L 31/022433 136/251 |
| 2005/0172996 A1 * | 8/2005 | Hacke | H01L 31/022433 136/256 |
| 2005/0194037 A1 * | 9/2005 | Asai | H01L 31/022425 136/256 |
| 2005/0199279 A1 | 9/2005 | Yoshimine et al. | |
| 2007/0095387 A1 * | 5/2007 | Fujii | H01L 31/0512 136/251 |
| 2007/0295381 A1 * | 12/2007 | Fujii | H01L 31/022433 136/244 |
| 2008/0149161 A1 * | 6/2008 | Nishida | H01L 31/022433 136/244 |
| 2008/0196757 A1 | 8/2008 | Yoshimine | |
| 2008/0276981 A1 * | 11/2008 | Kinoshita | H01L 31/022425 136/244 |
| 2008/0302412 A1 | 12/2008 | Chen | |
| 2009/0078305 A1 * | 3/2009 | Nishiwaki | H01L 31/022433 136/249 |
| 2009/0139570 A1 * | 6/2009 | Kinoshita | H01L 31/03762 136/256 |
| 2010/0275964 A1 | 11/2010 | Kinoshita | |

FOREIGN PATENT DOCUMENTS

| | | |
|---|---|---|
| EP | 1995792 A2 | 11/2008 |
| EP | 2 043 161 A2 | 4/2009 |
| JP | 2000-164901 A | 6/2000 |
| JP | 2008-205137 A | 9/2008 |
| JP | 2009-076739 A | 4/2009 |
| JP | 2009-088203 A | 4/2009 |
| WO | 00/31803 A1 | 6/2000 |

OTHER PUBLICATIONS

Office Action dated Mar. 31, 2014 issued in counterpart Chinese application No. 201080018185.9.

International Search Report, Written Opinion, and International Preliminary Report on Patentability, issued for International Application No. PCT/JP2010/057451.

Extended European Search Report for related EP Patent Application No. 10769736.69, dated Aug. 12, 2013, in 6 pages.

Office Action dated Mar. 9, 2015 issued in counterpart European Application No. 10 769 736.9.

* cited by examiner

F I G. 4 A
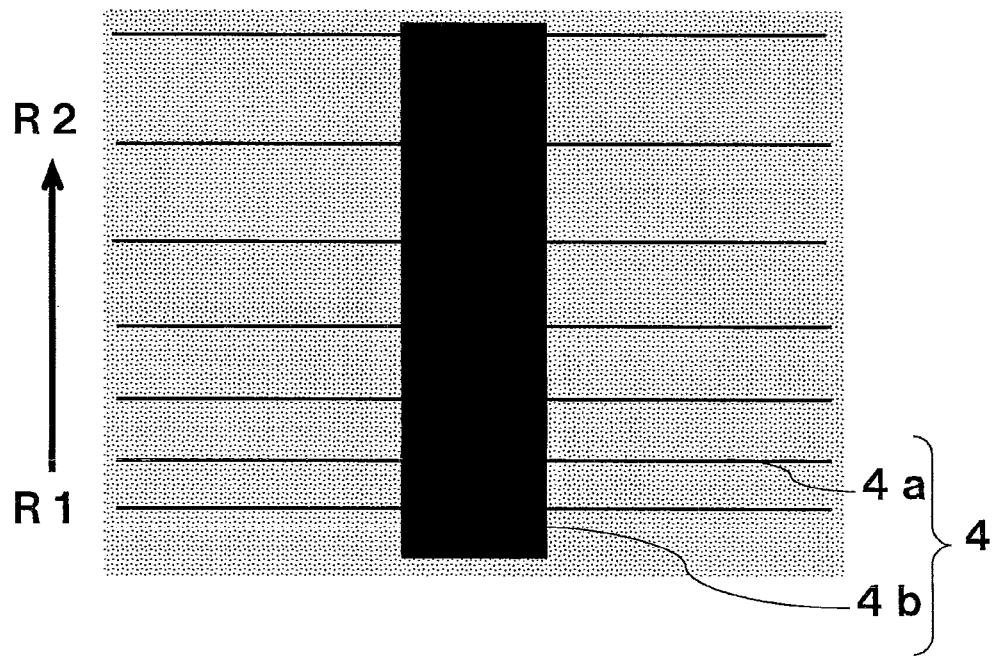
F I G. 4 B
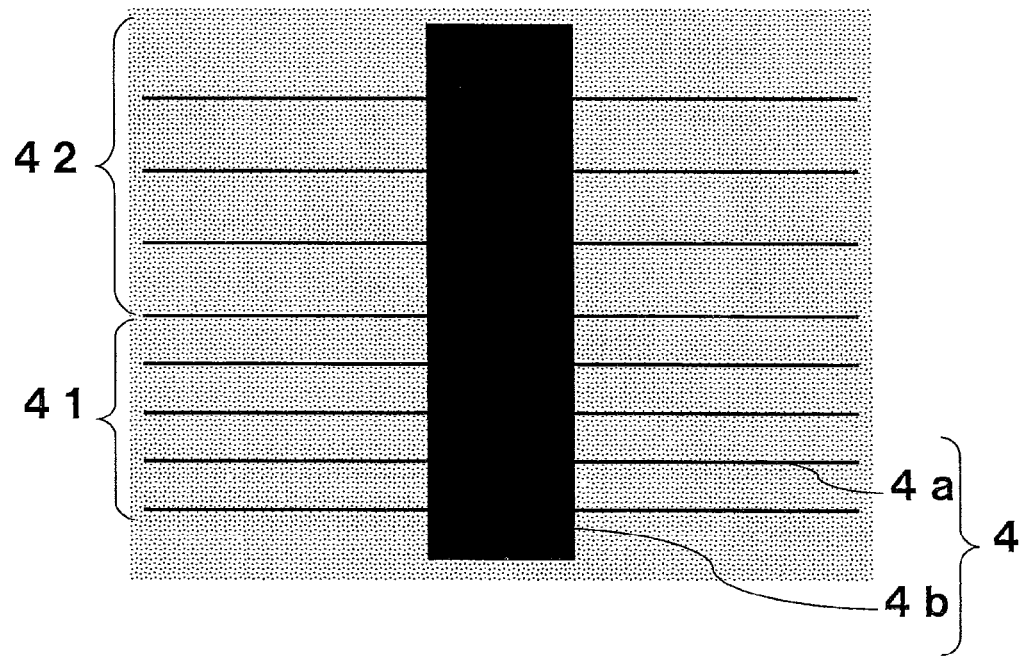

F I G . 9 A
15
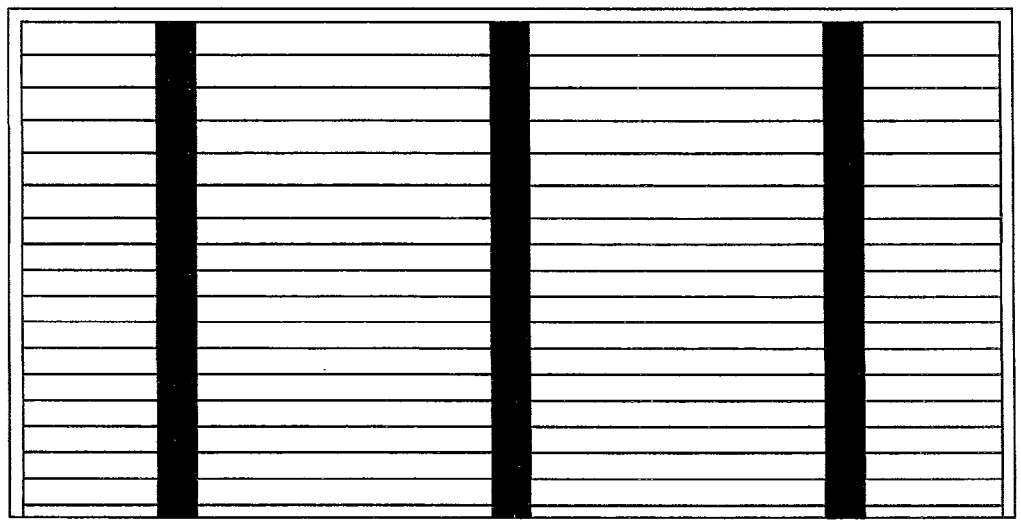
F I G . 9 B
16
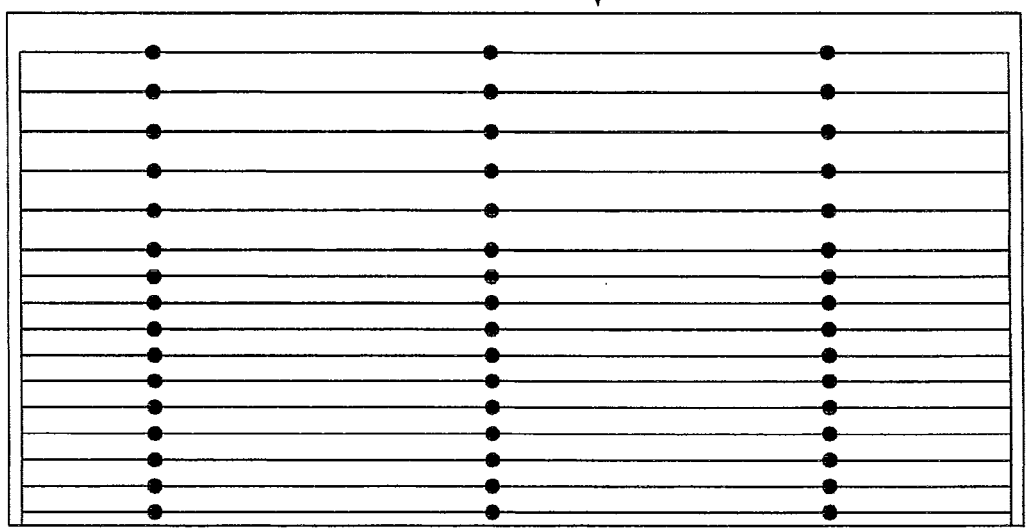

SOLAR CELL ELEMENT, SEGMENTED SOLAR CELL ELEMENT, SOLAR CELL MODULE, AND ELECTRONIC APPLIANCE

TECHNICAL FIELD

The present invention relates to a solar cell element, a segmented solar cell element obtained by segmenting the solar cell element, and a solar cell module and an electronic appliance including the solar cell element or the segmented solar cell element.

BACKGROUND ART

As shown in FIG. 10, for improving a current collection efficiency of a solar cell element 50, in general, a large number of linear current collector electrodes 52 are arranged at regular intervals on a semiconductor substrate 51 that forms the solar cell element 50.

It is necessary that an impurity element is doped into the semiconductor substrate 51 during preparation of the solar cell element 50. In this case, depending on manufacturing conditions, a situation may occur in which, for example, the amount of heat applied to an outside part of a middle part R1 of one main surface of the semiconductor substrate 51 is larger than the amount of heat applied to the middle part R1 so that a large amount of impurity element is contained in the outside part. That is, in FIG. 10, the amount of impurity element contained in both end parts R2 and R3 outside the middle part R1 may be larger as compared with the middle part R1.

In such a situation, in the middle part R1 of a surface of the semiconductor substrate 51, a carrier collection (current collection) tends to be insufficient, and improvement in a power generation efficiency of a solar cell element cannot be expected.

If the number of current collector electrodes 52 arranged on the semiconductor substrate 51 increases at regular intervals, the current collection efficiency of the solar cell element 50 can be improved. However, this shortens a distance between neighboring current collector electrodes. Therefore, in a case where a plurality of segmented solar cell elements obtained by segmenting the solar cell element 50 (for example, see Japanese Patent Application Laid-Open No. 2000-16490), the current collector electrode 52 and a dividing position (dividing line 8) may overlap each other, as shown in FIG. 10. This may cause an adverse effect on output characteristics of the segmented solar cell element, such as deterioration of an output thereof.

Thus, a solar cell element that promise an improvement in the power generation efficiency and a segmented solar cell element that causes a less influence on the output characteristics have been demanded, and thus a solar cell module and an electronic appliance including such a solar cell element or such a segmented solar cell element have been demanded.

SUMMARY OF THE INVENTION

A solar cell element according to one aspect of the present invention includes a semiconductor substrate that includes a first semiconductor layer of one conductivity type and a second semiconductor layer of the opposite conductivity type, and a plurality of linear current collector electrodes that are arranged on a first main surface of the semiconductor substrate at the second semiconductor layer side, the plurality of linear current collector electrodes being arranged at intervals in a direction from a middle part toward both end parts of the first main surface, wherein a distance between neighboring ones of the current collector electrodes located in the middle part and a distance between neighboring ones of the current collector electrodes located in the both end parts are different from each other.

A segmented solar cell element according to an embodiment of the present invention is obtained by segmenting the aforesaid solar cell element along some of the current collector electrodes.

A solar cell module according to an embodiment of the present invention includes the aforesaid solar cell element or the aforesaid segmented solar cell element.

An electronic appliance according to an embodiment of the present invention includes the aforesaid solar cell element or the aforesaid segmented solar cell element.

In the aforesaid solar cell element, and the solar cell module and the electronic appliance including the aforesaid solar cell element, it is likely that a power generation efficiency can be improved. Additionally, the segmented solar cell element with less influence on output characteristics can be provided. The solar cell module and the electronic appliance including such a segmented solar cell element has a high reliability.

BRIEF DESCRIPTION OF THE DRAWINGS

FIGS. 4A and 4B are enlarged plan view of a part of FIG. 1, in which FIG. 4A and FIG. 4B show exemplary arrangements of first current collector electrodes.

FIG. 9A and FIG. 9B are plan views schematically showing exemplary segmented solar cell elements according to an embodiment of the present invention.

EMBODIMENT FOR CARRYING OUT THE INVENTION

Some exemplary embodiments of the present invention will be described in detail with reference to the accompanying drawings.

<Basic Configuration of Solar Cell Element>

Figure 1:
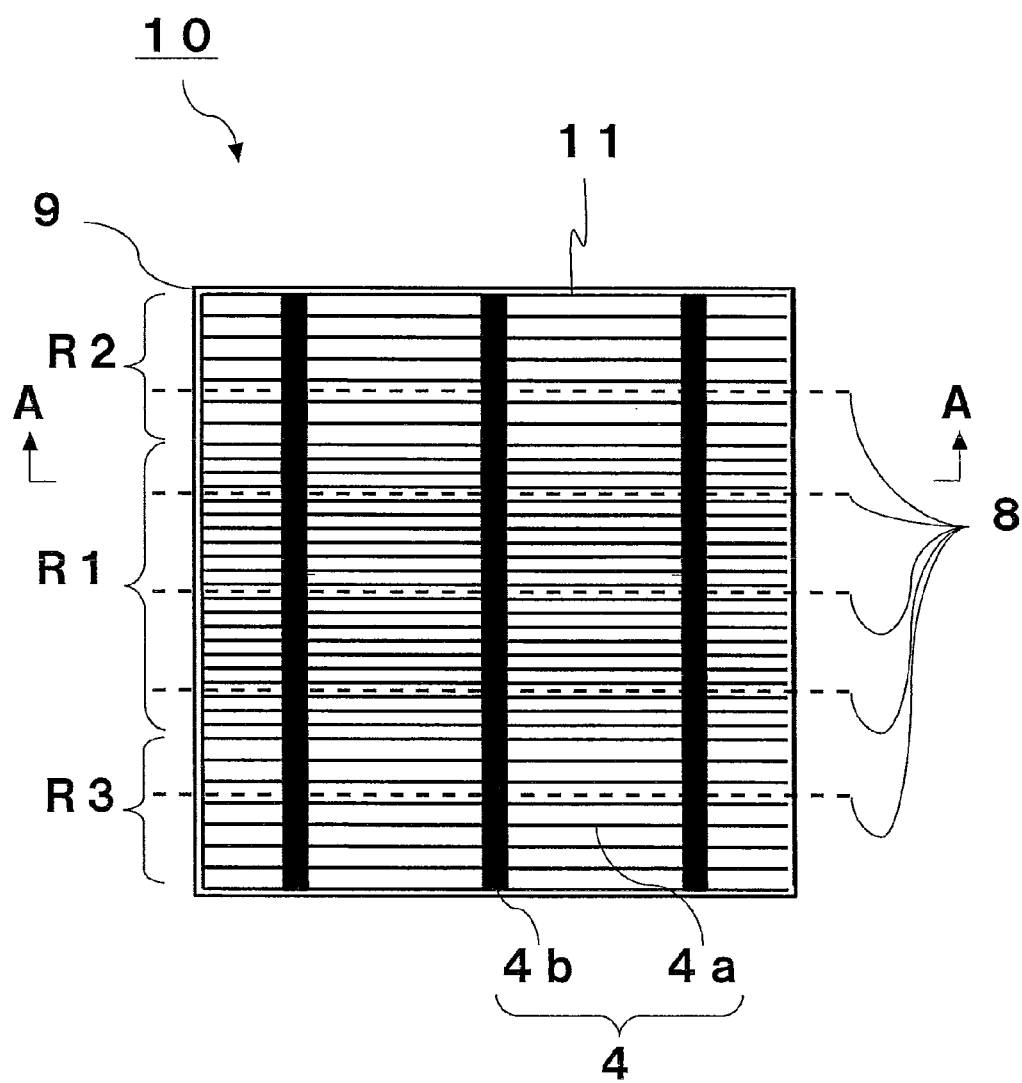
FIG. 1 is a plan view schematically showing an example of a light-receiving surface side of a solar cell element according to one embodiment of the present invention.

Firstly, a basic configuration of a solar cell element will be described. As shown in FIG. 1, a solar cell element 10 comprises, on a first main surface 11 which is a light-receiving surface of a semiconductor substrate 9, a plurality of, for example, linear first current collector electrodes 4a arranged at intervals in a direction from a middle part R1 to both end parts R2 and R3 of the first main surface 11. In FIG. 1, the reference numeral 4b denotes a first output extraction electrode having a larger width than that of the first current collector electrode 4a and arranged perpendicular to the first current collector electrodes 4a. The first current collector electrodes 4a and the first output extraction electrodes 4b form a first electrode 4 of the first main surface 11.

As shown in FIG. 1, a distance between the neighboring first current collector electrodes 4a located in the middle part R1 should be different from a distance between the neighboring first current collector electrodes 4a located in both end parts R2 and R3. Here, in a case where the distance between the neighboring first current collector electrodes 4a located in the middle part R1 and the distance between the neighboring first current collector electrodes 4a located in both end parts R2 and R3 are different from each other by 0.07 mm or more, it is defined that the distances between the first current collector electrodes 4a are different from each other.

Figure 2:
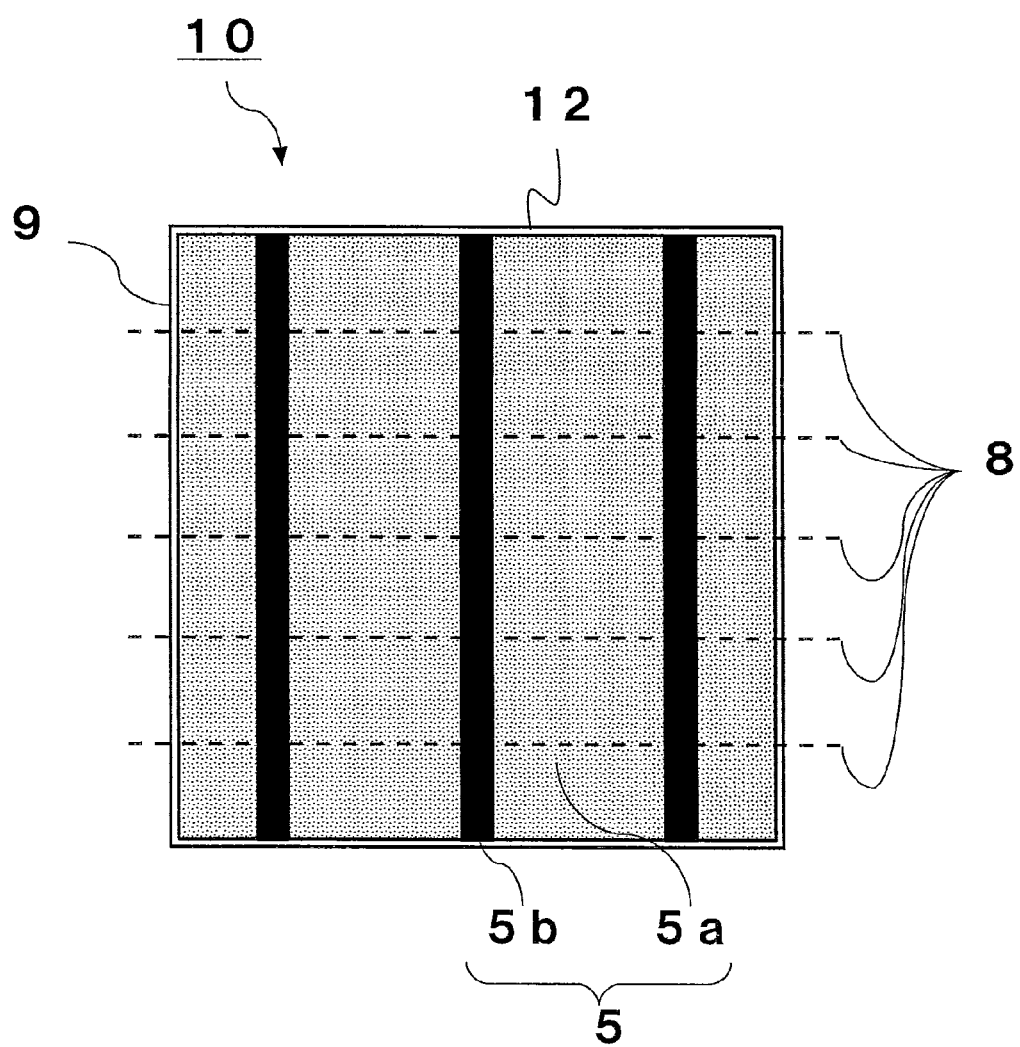
FIG. 2 is a plan view schematically showing an example of a back surface side of the solar cell element according to the embodiment of the present invention.

On the other hand, as shown in FIG. 2, on a second main surface 12 which is a back surface of the semiconductor substrate 9, a second electrode 5 is arranged which includes a second current collector electrode 5a formed substantially throughout the surface and second output extraction electrodes 5b extending in the same direction as the first output extraction electrode 4b.

In FIGS. 1 and 2, the reference numeral 8 denotes a dividing line for obtaining a segmented solar cell element from the solar cell element 10, which is a dividing line indicated for the purpose of segmenting the solar cell element 10 with, for example, a laser beam.

Figure 3:
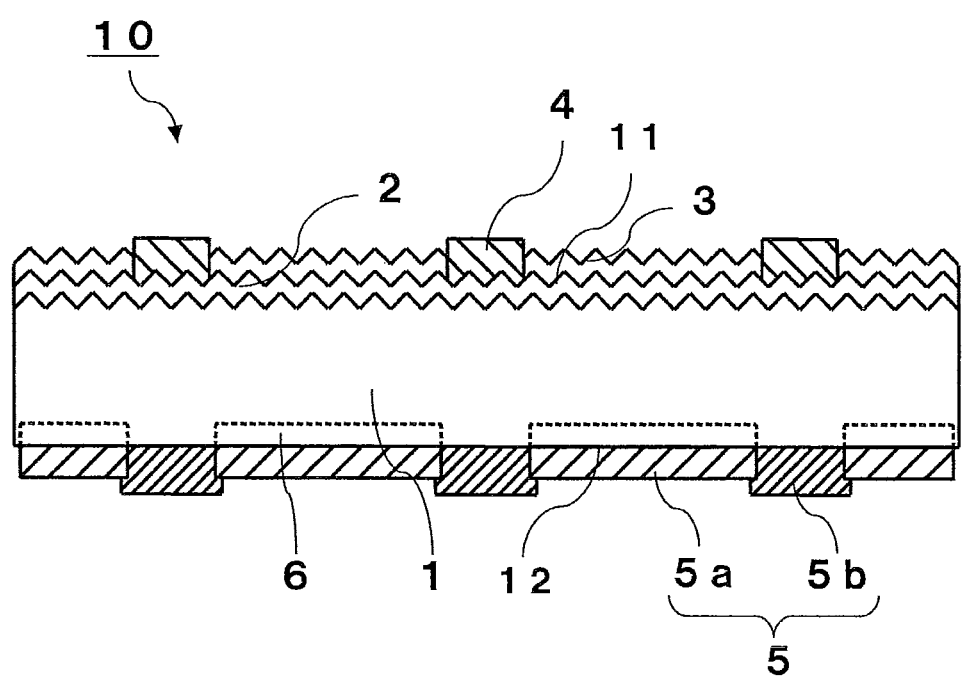
FIG. 3 is a schematic cross-sectional view as taken along the line A-A of FIG. 1.

As shown in FIG. 3, the semiconductor substrate 9 includes a first semiconductor layer 1 of one conductivity type and a second semiconductor layer 2 of the opposite conductivity type. The second semiconductor layer 2 is positioned at the first main surface 11 side of the semiconductor substrate 9. An anti-reflection film 3 is arranged on the first main surface 11 of the semiconductor substrate 9. A third semiconductor layer 6 of a BSF region (Back Surface Field) is provided at the second main surface 12 side of the semiconductor substrate 9.

Figure 7:
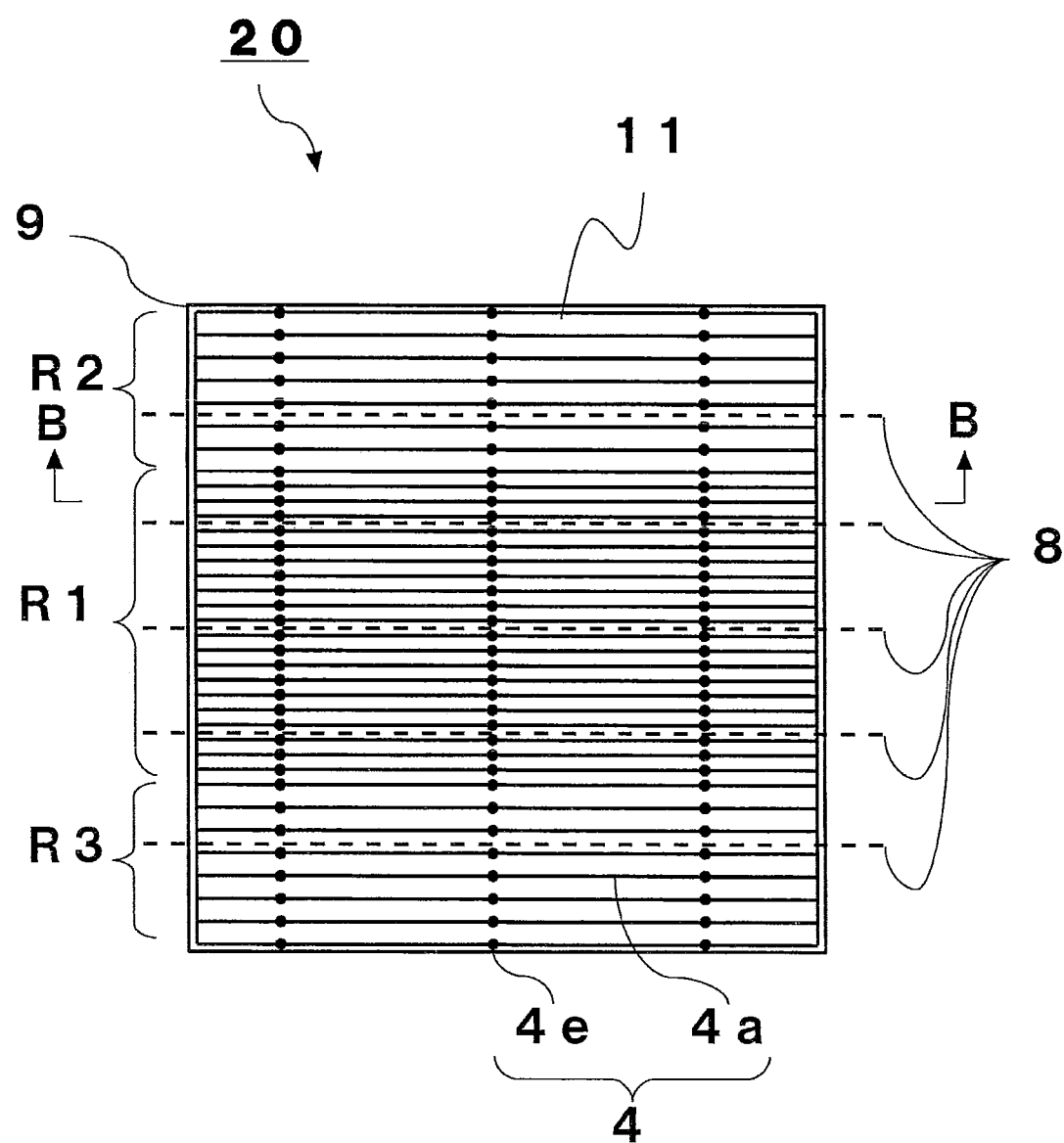
FIG. 7 is a plan view schematically showing an example of a light-receiving surface side of a solar cell element according to an embodiment of the present invention.
Figure 8:
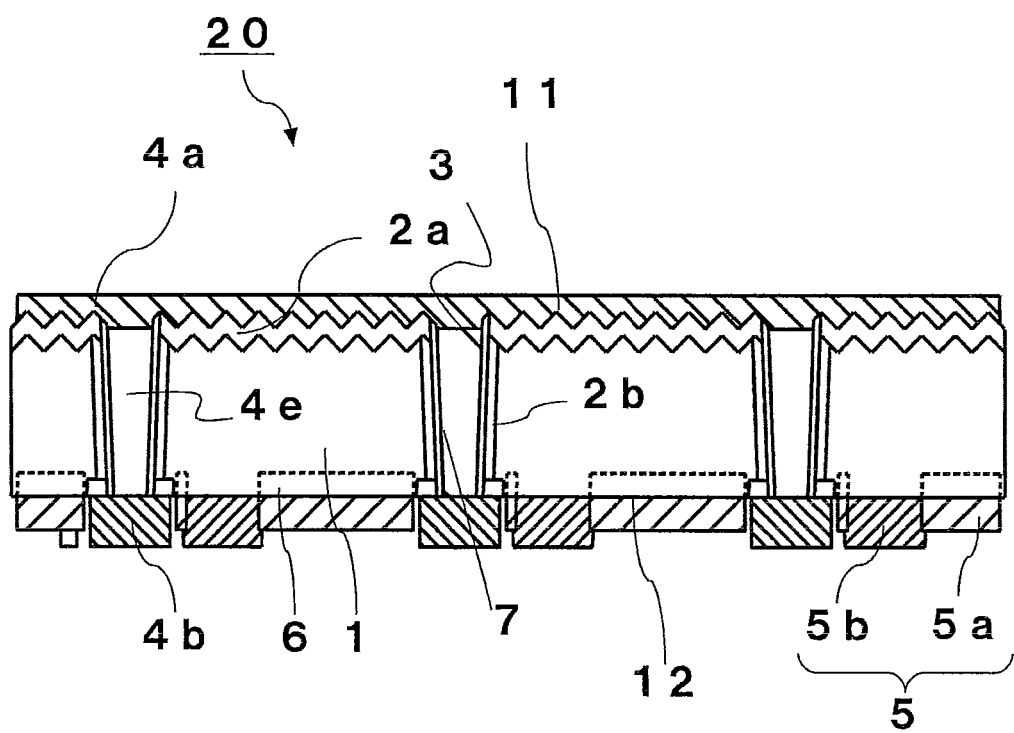
FIG. 8 is a schematic cross-sectional view as taken along the line B-B of FIG. 7.
Figure 10:
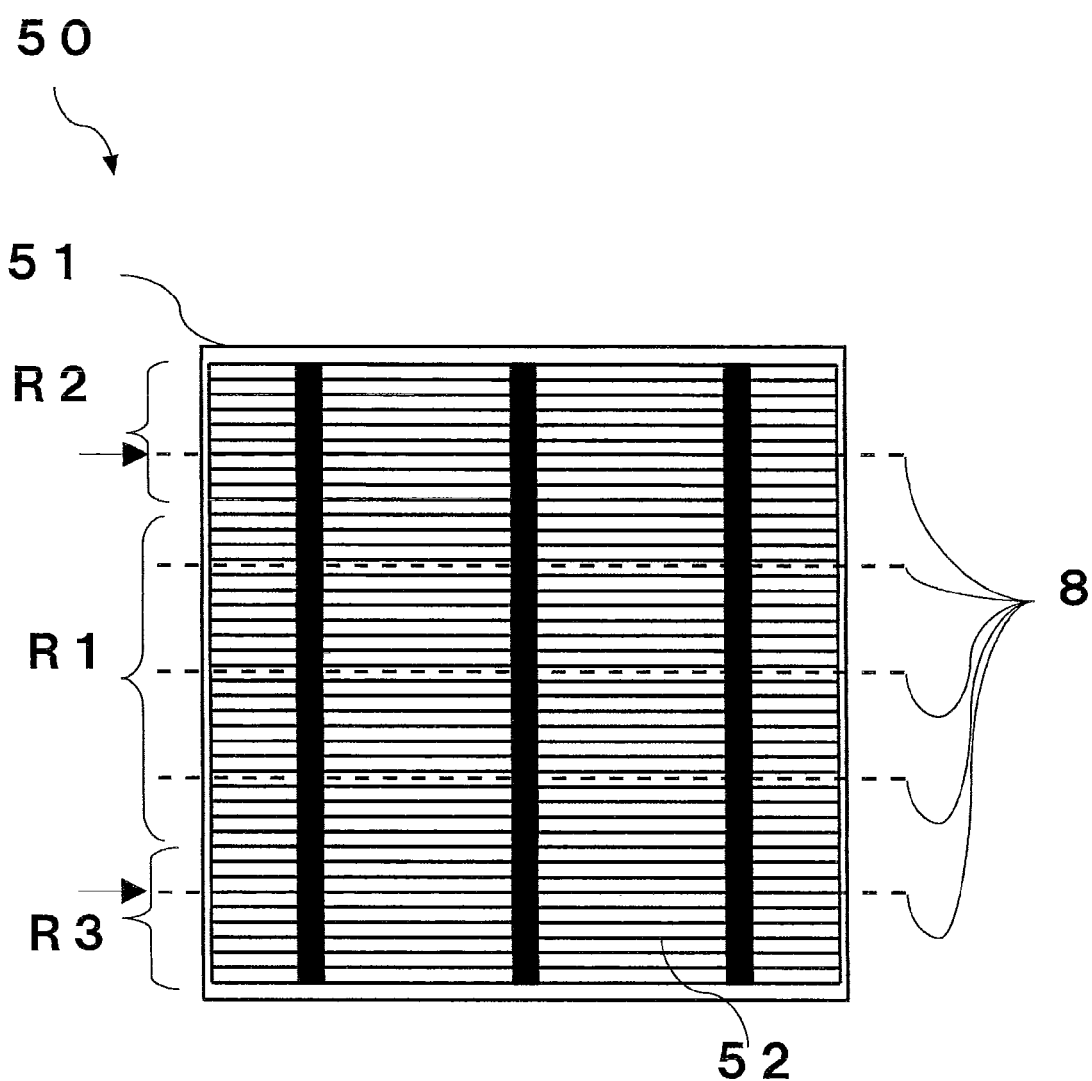
FIG. 10 is a plan view schematically showing a conventional solar cell element.

In a back-contact type solar cell element, for example, as shown in FIGS. 7 and 8, there are provided a plurality of through electrodes 4e connected to the first current collector electrodes 4a and formed through the semiconductor substrate 9 from the first main surface 11 to the second main surface 12 located at the opposite side, and the first output extraction electrodes 4b arranged on the second main surface 12 and connected to the through electrodes 4e.

Furthermore, the segmented solar cell element according to this embodiment is characterized by segmenting the above-mentioned solar cell element along some of the first current collector electrodes 4a. For example, as shown in FIG. 9A, the solar cell element 10 of FIG. 1 is segmented at dividing lines 8 located in the middle part R1, and thereby a segmented solar cell element 15 is obtained. As shown in FIG. 9B, a solar cell element 20 of FIG. 7 is segmented at dividing lines 8 located in the middle part R1, and thereby a segmented solar cell element 16 is obtained.

<Specific Example of Configuration of Solar Cell Element and Segmented Solar Cell Element>

Hereinafter, a specific example will be described.

In a configuration, the distance between the neighboring first current collector electrodes 4a located in the middle part R1 may be shorter than the distance between the neighboring first current collector electrodes 4a located in both end parts R2 and R3, as shown in FIG. 1. For example, such an arrangement is preferable that the distance between the neighboring first current collector electrodes 4a can gradually increase from the middle part R1 toward both end parts R2 and R3 of the first main surface 11 of the semiconductor substrate 9, as shown in FIG. 4A. This can reduce the degree of overlap between the first current collector electrodes 4a and the dividing lines 8 which may be otherwise caused by an accumulation of tolerance deviations in the first current collector electrodes 4a. Therefore, a designing to have the dividing line 8 to be positioned between the neighboring first current collector electrodes 4a is made easy.

The first electrode 4 includes, for example, the first current collector electrodes 4a each having a width of 50 to 200 μm and the first output extraction electrodes 4b perpendicular thereto each having a width of 1.3 to 2.5 mm. On the other hand, the second electrode 5 includes, for example, the second current collector electrode 5a arranged substantially throughout the second main surface and the second output extraction electrodes 5b each having a width of 1.5 to 7 mm.

An optimal combination of the distance between the neighboring first current collector electrodes 4a with the number of first current collector electrodes 4a makes it possible to prevent overlap between the dividing lines 8 and the first current collector electrodes 4a in the solar cell element 10. As a result, by preparing only a single kind of the standardized solar cell element 10 (parent substrate), a plurality of sizes of the segmented solar cell elements (child substrates) can be easily prepared.

In terms of an external appearance, the distance between the neighboring first current collector electrodes 4a is set to be shorter or longer, by a difference equal to or less than 0.2 mm, than an optimum value serving as a reference. It is preferable that the distance between the neighboring first current collector electrodes 4a located in the middle part R1 and the distance between the neighboring first current collector electrodes 4a located in the both end parts R2 and R3 are different from each other by 0.3 mm or less. Here, the optimum value means a value at which a power generation efficiency of the solar cell element is high in a case where the distance between the neighboring first current collector electrodes 4a is uniform from one end to the other end of the semiconductor substrate 1.

Figure 5:
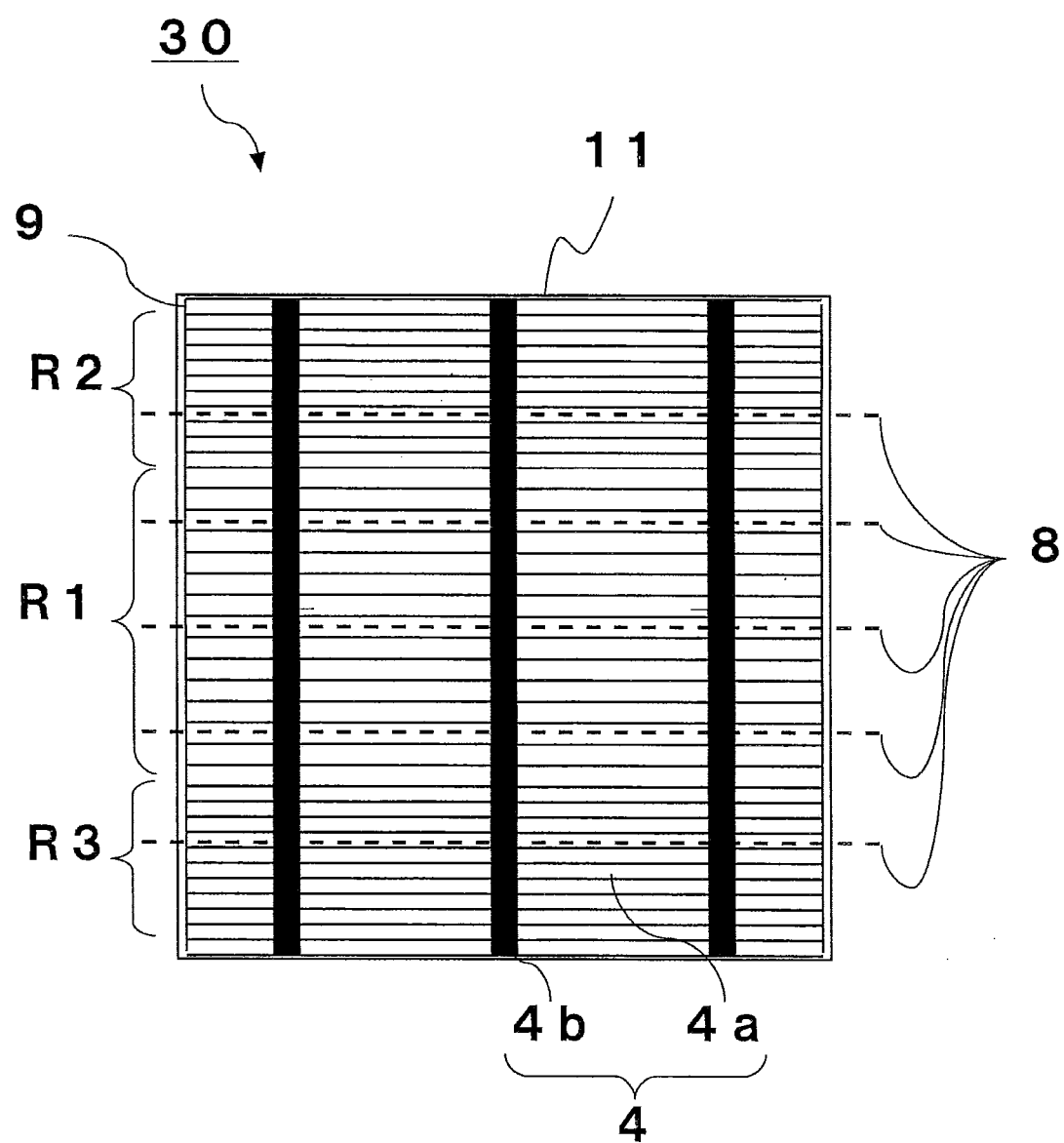
FIG. 5 is a plan view schematically showing an example of a light-receiving surface side of a solar cell element according to an embodiment of the present invention.

The distance between the neighboring first current collector electrodes 4a can be appropriately set in accordance with a distribution of an impurity concentration and a distribution of a sheet resistance of the second semiconductor layer 2. As in the solar cell element 30 of FIG. 5, the distance between the neighboring first current collector electrodes 4a may be increased in the middle part R1 of the first main surface 11 of the semiconductor substrate 9 while the distance between the neighboring first current collector electrodes 4a may be reduced in both end parts R2 and R3.

Figure 6:
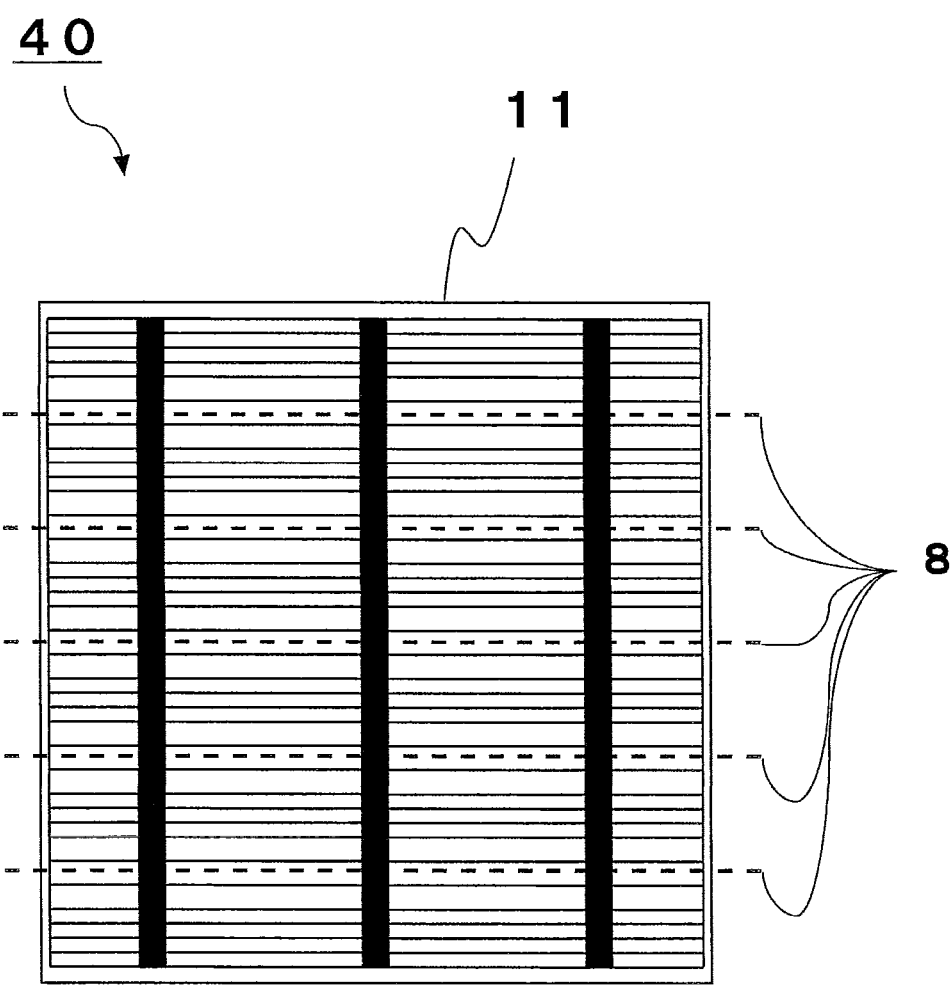
FIG. 6 is a plan view schematically showing an example of a light-receiving surface side of a solar cell element according to an embodiment of the present invention.

As shown in FIG. 4B and FIG. 6, a first current collector electrode group 41 in which an average distance between the neighboring first current collector electrodes 4a is short and a second current collector electrode group 42 in which the average distance between the neighboring first current collector electrodes 4a is long may be arranged alternately or appropriately. By adopting this configuration, too, the degree of overlap between the current collector electrodes 4a and the cutting positions (dividing lines 8) which may be otherwise caused by gradually accumulated tolerance deviations can be reduced, and therefore the designing to have the dividing position line 8 to be positioned between the first current collector electrodes 4a is made easy.

Moreover, it is preferable that the number of first current collector electrodes 4a is an even number. This is provided for segmented solar cell elements having the same size by cutting the first current collector electrode into left and right symmetrical parts. For example, even in a case where the number of first current collector electrodes 4a calculated based on the optimum value of the distance between the first current collector electrodes 4a is an odd number, the number of first current collector electrodes 4a can be modified to an even number by combination of the first current collector electrode group 41 in which the average distance between the neighboring first current collector electrodes 4a is short and the second current collector electrode group 42 in which the average distance between the neighboring first current collector electrodes 4a is long.

The optimal combination of the interval between the first current collector electrodes 4a with the number of first current collector electrodes 4a makes it possible to avoid positioning the first current collector electrodes 4a in the dividing lines 8 of the parent substrate of the solar cell element 10. As a result, by preparing only a single kind of the standardized parent substrate of the solar cell element 10, a plurality of sizes of the segmented solar cell elements can be easily produced.

In terms of an external appearance, the average distance between the neighboring first current collector electrodes 4a in the first current collector electrode group 41 and the second current collector electrode group 42 is set to be shorter or longer than the optimum value by a difference equal to or less than 0.2 mm. It is preferable that the distance in the first current collector electrode group 41 and the distance in the second current collector electrode group 42 are different from each other by 0.3 mm or less.

Referring to FIG. 4B, it is preferable that the first current collector electrode group 41 is arranged in a first region in which the sheet resistance of the first main surface 11 of the semiconductor substrate 9 is high while the second current collector electrode group 42 is arranged in a second region in which the sheet resistance is lower than in the first region. This enables carriers to be successfully collected in each of the first region and the second region.

Here, if a difference between a sheet resistance value of the first region and a sheet resistance value of the second region is set to be a small value of 5Ω/□ or more and 2Ω/□ or less, the difference between the interval in the first current collector electrode group 41 of the first region and the interval in the second current collector electrode group 42 of the second region can be reduced. Thereby, a difference between the first current collector electrode group 41 and the second current collector electrode group 42 can be set small, and therefore the external appearance is not impaired.

It is preferable that the difference between the sheet resistances of the first region and the second region of the second semiconductor layer 2 is achieved by making the first region of the second semiconductor layer 2 thinner than the second region thereof. A difference between the thickness of the first region and the thickness of the second region may be set to be 0.1 μm or more and 1 μm or less at a position where the impurity concentration is $1 \times 10^{18}$ [atoms/cm$^3$].

It is preferable that the difference between the sheet resistances of the first region and the second region of the second semiconductor layer 2 is achieved by making the maximum impurity concentration in the first region of the second semiconductor layer 2 lower than the maximum impurity concentration in the second region thereof. A difference between the maximum impurity concentration of the first region and the maximum impurity concentration of the second region may be set to be $1 \times 10^{20}$ [atoms/cm$^3$] or more and $8 \times 10^{20}$ [atoms/cm$^3$] or less.

In this manner, in a case where the distance between the neighboring first current collector electrodes 4a located in the middle part R1 is shorter than the distance between the neighboring first current collector electrodes 4a located in both end parts R2 and R3, the sheet resistance in the middle part R1 of the second semiconductor layer 2 is accordingly set higher than the sheet resistance of the second semiconductor layer 2 at the both end parts R2 and R3 side, and thereby the power generation efficiency of the solar cell element can be improved by approximately 0.1%.

Here, the sheet resistance value can be measured by a four-probe method. Four metal needles directly-aligned is brought into pressure-contact with a surface of the semiconductor substrate 9, and a voltage that is generated between two inner needles when a current flows through the two outer needles is measured, and a resistance value is obtained by Ohm's law based on the voltage and the current that has flown.

In the solar cell element according to this embodiment, it is preferable to provide the first region in which the sheet resistance of the second semiconductor layer 2 is high and the second region in which the sheet resistance of the second semiconductor layer 2 is low, and to arrange the first current collector electrode group 41 and the second current collector electrode group 42 in the first region and the second region, respectively. That is, the second semiconductor layer 2 is formed such that the sheet resistance in the middle part R1 can be higher than the sheet resistance in both end parts R2 and R3.

Although in general the second semiconductor layer 2 is formed so as to cause no variation in the sheet resistance throughout the semiconductor substrate 9, in this embodiment, the first region and the second region having different sheet resistances are provided and the positions where the first current collector electrode group 41 and the second current collector electrode group 42 are arranged are determined in accordance with the sheet resistances of the second semiconductor layer 2. This can further reduce a deterioration in output characteristics of the solar cell element, and in some cases, can improve the output characteristics.

Various methods may be adopted for forming the first region and the second region of the second semiconductor layer 2. For example, the second semiconductor layer 2 having a uniform sheet resistance is formed, and then a dopant is diffused again only in a desired region serving to the second region, or alternatively a part of the second semiconductor layer 2 in a region serving as the first region is etched. In this case, the first region may be formed in either of the middle part R1 and both end parts R2 and R3. In a case of diffusing the dopant again, the diffusion is preferably performed with a diffusion barrier layer being provided in a region where the diffusion should not occur. In a case of etching, the etching is preferably performed with an etching barrier layer being provided in a region that should not be etched.

As the above-described method, it is also possible to form the first region and the second region of the second semiconductor layer 2 without increasing the number of process steps. For example, in an application and thermal diffusion method, a paste containing a dopant is applied with the thickness thereof varying, so that the first region is formed in a region where the thickness of the application is small and the second region is formed in a region where the thickness of the application is large. For example, in a gas-phase thermal diffusion method, the uniformity of a gas in a furnace is impaired by reducing a gas flux flowing into the furnace. Thus, an influence of thermal diffusion increases. Therefore, a larger amount of heat is applied to an outer peripheral portion of the semiconductor substrate than the middle part thereof, to make it easy that the first region is formed in the middle part R1 of the semiconductor substrate 9 and the second region is formed in both end parts R2 and R3 thereof.

Moreover, in this embodiment, the first output extraction electrode 4*b* is arranged on the first main surface 11 so as to be substantially perpendicular to the first current collector electrodes 4*a*. This enables the carriers collected by the first current collector electrodes 4*a* to be efficiently extracted from the first output extraction electrodes 4*b*.

Furthermore, as shown in FIGS. 7 and 8, it is preferable to arrange a plurality of through holes 7 extending through the semiconductor substrate 9 from the first main surface 11 to the second main surface 12, the through electrodes 4*e* formed in the through holes 7 and connected to the first current collector electrodes 4*a*, and the first output extraction electrodes 4*b* formed on the second main surface 12 and connected to the through electrodes 4*e*. In the example describe above, the first output extraction electrodes 4*b* are formed at the first main surface 11 side. The configuration of this embodiment is also adoptable in a through-hole type back-contact structure described below.

The solar cell element 20 including the through-hole type back-contact structure shown in FIGS. 7 and 8 comprises the semiconductor substrate 9 including the first main surface 11 and the second main surface 12, the plurality of through holes 7 extending through the semiconductor substrate 9, and the first electrode 4.

Here, the first electrode 4 comprises the first current collector electrodes 4*a* formed on the first main surface 11, the first output extraction electrodes 4*b* formed on the second main surface 12, and the through hole electrodes 4*e* formed in the through hole 7 and electrically connected to the first output extraction electrodes 4*b* and the first current collector electrodes 4*a*.

In this manner, the first electrode 4 further includes the first output extraction electrodes 4*b* formed on the second main surface 12 and connected to the through electrodes 4*e*. Therefore, the current collected at the first main surface 11 side can be efficiently extracted from the second main surface 12 side.

As shown in FIG. 7, in the first current collector electrodes 4*a* of the first main surface 11 that are formed of a plurality of fine lines that are formed substantially in parallel with one another on the first main surface 11, each of the fine lines is connected to at least one of the through electrodes 4*e*.

This enables the carriers generated in the semiconductor substrate 9 to be efficiently collected and extracted from the first output extraction electrodes 4*b* at the back second main surface 12 side through the through electrodes 4*e*.

In a method for segmenting the solar cell element according to this embodiment, the above-described solar cell element 20 is used, and cut based on a center line of the first current collector electrode group arranged in the middle part R1 shown in FIG. 7 while being cut also in the second current collector electrode group arranged in both end parts R2 and R3. Thereby, in the segmented solar cell elements obtained as a result of equal segmentation, the first current collector electrodes 4*a* do not overlap the dividing lines 8.

That is, although the optimal distance between the neighboring first current collector electrodes 4*a* is normally set based on a relationship between the sheet resistance of the second semiconductor layer 2 and a line resistance of the first current collector electrode 4*a*, it is not necessary to consider them in the method for segmenting the solar cell element according to this embodiment, and thus a deterioration in the output characteristics of the solar cell element which is caused by a change in the shape of the electrode can be reduced.

<Method for Manufacturing Solar Cell Element>

Hereinafter, a method for manufacturing the solar cell element according to this embodiment will be described.

Here, manufacturing of a semiconductor substrate serving as the first semiconductor layer 1 will be described. In a case where the semiconductor substrate is a monocrystalline silicon substrate, it is formed by a Czochralski method, for example, and in a case where the semiconductor substrate is a polycrystalline silicon substrate, it is formed by a casting process, for example. In the following, a description will be given of an example where a p-type polycrystalline silicon is used.

Firstly, a polycrystalline silicon ingot is prepared by the casting process, for example. Then, the ingot is sliced into a thickness of 250 µm or less, for example. Then, for the purpose of cleaning a mechanical-damaged layer and a contaminated layer on a cut surface of the semiconductor substrate, it is desirable to etch a surface to an extremely small degree with NaOH, KOH, hydrofluoric acid, a mixture of nitric acid and hydrofluoric acid, or the like. It is further desirable that this etching step is followed by a wet-etching process of forming a fine unevenness on a surface of the semiconductor substrate.

Here, in a case of the back-contact type solar cell element shown in FIGS. 7 and 8, the through holes 7 are formed between the first main surface 11 and the second main surface 12 of the semiconductor substrate.

The through holes 7 are formed by using a mechanical drill, a water-jet, a laser machining apparatus, or the like. In the formation of the through holes 7, the process is performed from the second main surface 12 side toward the first main surface 11 side of the semiconductor substrate, in order to avoid damaging the first main surface 11. Here, if the degree of damaging to the semiconductor substrate caused by the process is small, the process may be performed from the first main surface 11 side toward the second main surface 12 side. It is preferable to perform etching for removing a damaged layer after the formation of the through holes 7.

Then, the second semiconductor layer 2 of n-type that is the opposite conductivity type is formed in a surface layer of a desired region of the semiconductor substrate. Such a second semiconductor layer 2 is formed by, for example, the application and thermal diffusion method in which paste-like $P_2O_5$ is applied to the surface of the semiconductor substrate and then thermally diffused, or the gas-phase thermal diffusion method in which gaseous $POCl_3$ (phosphorus oxychloride) is used as a diffusion source. The second semiconductor layer 2 is formed to have a depth of about 0.2 to 2 µm and a sheet resistance of about 60 to 150Ω/□.

In the back-contact type solar cell element, it is preferable that the second semiconductor layer 2 is also formed within the through holes 7 and on the second main surface 12. The method for forming the second semiconductor layer 2 is not limited to the above-described method. For example, a thin-film deposition technique may be used to form, for example, a hydrogenated amorphous silicon film, or a crystalline silicon film including a microcrystalline silicon film. Moreover, an i-type silicon region may be formed between the first semiconductor layer 1 and the second semiconductor layer 2.

As the paste containing the dopant used in the application and thermal diffusion method, for example, a phosphorus salt such as phosphorus oxide or phosphoric acid is adopted for n-type. For p-type, a dopant containing a boron salt such as boron oxide or boric acid and a silicon compound such as ethyl silicate or polysilazane being mixed into a solvent such as ethyl alcohol, isopropyl alcohol, or butyl alcohol is adopted, and if necessary, a resin such as methylcellulose, ethylcellulose, nitrocellulose, methyl methacrylate, or polyethyleneglycol is mixed.

As for an application method, for example, the paste is applied onto the semiconductor substrate by using a spin coating method, a spraying method, a screen-printing method, or the like. A viscosity of the paste may be appropriately adjusted in accordance with the application method used. For example, in a case of adopting the screen-printing method, a paste having a viscosity of about 50 to 350 Pa·s is used. After application, the paste may be dried at a temperature of 70 to 150° C. for a few minutes.

Then, a heat-treatment is performed in an inert gas atmosphere such as an argon atmosphere or a nitrogen atmosphere, or in an oxidizing atmosphere containing oxygen and the like, and thereby the paste is vitrified to form a glass layer containing the dopant and additionally the dopant contained in the glass layer is diffused on the surface of the semiconductor substrate and within the semiconductor substrate. As for a heat-treatment temperature, for example, heating is performed at a temperature of 300 to 600° C. for about 5 to 20 minutes, and then heating is performed at a temperature of 600 to 900° C. for about 10 to 40 minutes in order to allow the dopant contained in the glass layer to be diffused in the substrate. If the thickness of application of the paste is varied, the second semiconductor layer having a high sheet resistance is formed in a region where the thickness of application is small while the second semiconductor layer having a high sheet resistance is formed in a region where the thickness of application is large.

In the gas-phase thermal diffusion method, a plurality of semiconductor substrates are placed in a process tube made of quartz and including a gas inlet and a gas outlet, and a diffusion gas obtained by bubbling liquid $POCl_3$ with a carrier gas (such as nitrogen gas, oxygen gas or so) to gasify the $POCl_3$ as well as an inert gas is introduced into the process tube. In an atmosphere containing a dopant, the semiconductor substrate 1 is heat-treated at a temperature of about 600 to 900° C. for about 5 to 30 minutes by heating means provided at an outer circumference of the process tube. As a result, a glass layer containing the dopant is formed on the surface of the semiconductor substrate, and the dopant existing in the glass layer is diffused near the surface of the semiconductor substrate. Here, a ratio of the flow rates of the diffusion gas and the inert gas being supplied is set to be, for example, 1:2 to 1:20, and more preferably 1:4 to 1:15. Then, in an inert gas atmosphere such as an argon atmosphere or a nitrogen atmosphere, a heat-treatment is performed at a temperature higher than the foregoing temperature by 50 to 200° C. for about 10 to 40 minutes. Thereby, the dopant existing in the glass layer of the semiconductor substrate surface is further diffused near the semiconductor substrate surface, and additionally the dopant diffused near the surface of the semiconductor substrate is diffused to the inside of the substrate to form the second semiconductor layer 2.

Then, the anti-reflection film 3 is formed. The anti-reflection film 3 is formed by using, for example, a PECVD (plasma enhanced chemical vapor deposition) method, a vapor-deposition method, or a sputtering method. For example, in a case where the anti-reflection film 3 which is a silicon nitride film is formed by the PECVD method, the inside of a reaction chamber is set to be about 500° C., and a mixed gas of $Si_3H_4$ (silane) and $NH_3$ (ammonia) is diluted with $N_2$ (nitrogen) and plasmarized by glow-discharge decomposition to be deposited so that the anti-reflection film 3 is formed.

Then, the third semiconductor layer 6 in which a semiconductor impurity of one conductivity type is diffused at a high concentration is formed at the second main surface 12 side of the semiconductor substrate 1. As a manufacturing method, for example, a thermal diffusion method using $BBr_3$ (boron tribromide) as a diffusion source may be adopted to form the third semiconductor layer 6 at a temperature of about 800 to 1100° C. A method may also be adopted in which an aluminum paste containing powdered aluminum, an organic vehicle, and the like is applied by a printing method and then heat-treated (baked) at a temperature of about 600 to 850° C., to diffuse the aluminum in the semiconductor substrate 1. If the method in which the aluminum paste is printed and baked is adopted, a desired diffusion region can be formed only on a printed surface. In this case, moreover, it is not necessary to remove the n-type second semiconductor layer that has been formed on the second main surface side simultaneously with the formation of the second semiconductor layer 2. Thus, in the solar cell element 10, it suffices that pn-junction isolation is performed by using a laser or the like only in a peripheral portion at the second main surface 12 side. In the back-contact type solar cell element 20, it suffices that pn-junction isolation is further performed at an interface with the third semiconductor layer 6. The method for forming the third semiconductor layer 6 is not limited to the above-described method. For example, a thin-film technique may be used to form a hydrogenated amorphous silicon film, or a crystalline silicon film including a microcrystalline silicon film. Furthermore, an i-type silicon region may be formed between the first semiconductor layer 1 and the third semiconductor layer 6.

Then, the first electrode 4 and the second electrode 5 are formed as follows. The first electrode 4 is prepared using an electrode paste (silver paste) that contains a powdered metal such as silver, an organic vehicle, and glass frits.

In a case of the solar cell element 10 shown in FIGS. 1 to 3, the electrode paste is applied to the first main surface of the semiconductor substrate 1, and then baking is performed at the maximum temperature 600 to 850° C. for about a few tens of seconds to a few tens of minutes. As a result, the anti-reflection film 3 is broken because of a fire-through process and the first electrode 4 is formed on the semiconductor substrate 9.

In a case of the back-contact type solar cell element 10, an electrode paste is applied from the first main surface 11 side of the semiconductor substrate 9 so that a silver paste is loaded in the through holes 7, and then baking is performed at the maximum temperature 600 to 850° C. for about a few tens of seconds to a few tens of minutes. As a result, the first current collector electrodes 4a are formed on the first main surface 11 and the through electrodes 4e are formed within the through holes 7. An electrode paste is applied from the second main surface 12 side of the semiconductor substrate 9, and then baking is performed at the maximum temperature 500 to 850° C. for about a few tens of seconds to a few tens of minutes, thereby forming the first output extraction electrodes 4b on the second main surface 12. Preferably, after the application, the solvent is evaporated by drying the electrode paste at a predetermined temperature. Examples of the application method include the screen-printing method.

If the electrode paste is applied by using a plate maker including an opening that is shaped such that the distance between the neighboring first current collector electrodes 4a located in the middle part R1 can be different from the distance between the neighboring first current collector electrodes 4a located in both end parts R2 and R3, the first current collector electrodes 4a can be formed in such a manner that the distance between the neighboring first current collector electrodes 4a located in the middle part R1 is different from the distance between the neighboring first current collector electrodes 4a located in both end parts R2 and R3.

Next, the second electrode 5 will be described. Firstly, the second current collector electrodes 5a are prepared by using, for example, aluminum paste containing powdered aluminum and an organic vehicle. This paste is applied to a substantially entire surface of the second main surface 12 except parts where the first electrode 4 and the second output extraction electrodes 5b are to be formed. Examples of the application method include the screen-printing method. From the viewpoint of making it difficult for the paste to adhere to other portions during an operation, it is preferable that a solvent is evaporated by drying the paste at a predetermined temperature after the paste is applied.

The second output extraction electrodes 5b are prepared by using, for example, a silver paste containing a powdered metal made of powdered silver or the like, an organic vehicle, and glass frits. The silver paste is applied into a predetermined shape. The silver paste is applied to a position that is in contact with a part of the aluminum paste, and thereby the second output extraction electrode 5b and the second current collector electrode 5a partially overlap each other. Examples of the application method include the screen-printing method. Preferably, after the application, the solvent is evaporated by drying the silver paste at a predetermined temperature.

Then, the semiconductor substrate 9 is baked in a baking furnace at the maximum temperature 600 to 850° C. for about a few tens of seconds to a few tens of minutes. As a result, the second electrode 5 is formed at the second main surface 12 side of the semiconductor substrate 9.

Although a printing/baking process is adopted for forming electrodes of the first electrode 4 and the second electrode 5, the electrodes may be formed by a thin-film forming process such as vapor deposition and sputtering, or by a plating process.

Next, a segmentation method will be described. A laser is radiated to the first main surface side or the second main surface side of the parent substrate of the solar cell element along the desired dividing line 8, to form a dividing groove. Examples of the laser used include a YAG laser. As laser conditions, the wavelength is set to be 1.06 μm, the output is set to be 10 to 30 W, the beam divergence angle is set to be 1 to 5 mrad, and the scanning speed is set to be 50 to 300 mm/s. The depth of the dividing groove is preferably set to be 25% or more of the thickness of the semiconductor substrate 1, which enables the parent substrate of the solar cell element to be easily segmented along the dividing groove.

By applying an external force to the parent substrate of the solar cell element including the dividing groove formed thereon to segment it, the child substrates (segmented solar cell elements) of the solar cell element can be formed. For example, the child substrates can be prepared by the parent substrate being bent along the dividing groove by hand. The child substrate of the solar cell element comprises a configuration of the parent substrate of a large-size solar cell element, for example, the first electrode 4 and the second electrode 5, and the child substrate in the segmented state can function as a solar cell element. Here, if necessary, the step of adding another configuration to the segmented solar cell element obtained as a result of segmentation may be performed.

In general, the optimal distance between the neighboring first current collector electrodes 4a is set based on the relationship between the sheet resistance of the second semiconductor layer 2 and the line resistance of the first current collector electrode 4a. Here, if the average distance between the neighboring first current collector electrodes 4a in the first current collector electrode group 41 and the second current collector electrode group 42 is designed to be a value close to the optimum value, the problem of a deterioration in the output characteristics of the solar cell element which is caused by a change in the shape of the electrode can be reduced.

<Solar Cell Module and Electronic Appliance>

The solar cell module according to this embodiment can be configured such that, for example, one solar cell element described above, one segmented solar cell element described above, a plurality of solar cell elements described above electrically connect in series with one another, or a plurality of segmented solar cell elements described above electrically connect in series with one another is sealed on a support substrate made of glass, a resin, a metal, or the like by using a filler having an excellent humidity resistance such as EVA (Ethylene Vinyl Acetate). In this case, a frame body made of a metal, a resin, or the like, can be provided around the support substrate.

An electronic appliance according to this embodiment is an electrical product based on electronics technologies, and includes an apparatus for digital-processing information, an apparatus for electrically analog-processing a video image and a sound, and the like. That is, for example, the solar cell module or the segmented solar cell element is usable as a power source of a mobile phone, a clock, a desktop calculator, or the like.

If the solar cell element or the segmented solar cell element according to this embodiment is adopted as power generation means of a solar cell module and an electronic appliance, it is likely that the power generation efficiency can be improved, and a solar cell module and an electronic appliance with an excellent reliability can be provided.

DESCRIPTION OF THE REFERENCE NUMERALS

1: first semiconductor layer
2: second semiconductor layer
3: anti-reflection film
4: first electrode
4a: first current collector electrode
4b: first output extraction electrode
4e: through electrode
5: second electrode
5a: second current collector electrode
5b: second output extraction electrode
6: third semiconductor layer
7: through hole
8: dividing line
9: semiconductor substrate
10: solar cell element
11: first main surface
12: second main surface
15: segmented solar cell element
16: segmented solar cell element
20: solar cell element
30: solar cell element
40: solar cell element
41: first current collector electrode group
42: second current collector electrode group
R1: middle part
R2: end part
R3: end part

The invention claimed is:

1. A solar cell element comprising a semiconductor substrate that includes a first semiconductor layer of one conductivity type and a second semiconductor layer of the opposite conductivity type, and a plurality of linear current collector electrodes that are arranged on a first main surface of the semiconductor substrate at a second semiconductor layer side, the plurality of linear current collector electrodes being arranged at intervals in a direction from a middle part toward both end parts of the first main surface, wherein a distance between neighboring ones of the current collector electrodes located in the middle part and a distance between neighboring ones of the current collector electrodes located in the both end parts are different from each other, wherein a first output extraction electrode crossing the current collector electrodes is arranged, wherein the first output extraction electrode intersects the plurality of linear current collector electrodes at a position separated from an end portion of the linear current collector electrodes, so that the end portions extend from the first output extraction electrode, and wherein a sheet resistance of the second semiconductor layer in the middle part is higher than a sheet resistance of the second semiconductor layer in the both end parts.

2. The solar cell element according to claim 1, wherein the distance between neighboring ones of the current collector electrodes located in the middle part is shorter than the distance between neighboring ones of the current collector electrodes located in the both end parts.

3. The solar cell element according to claim 1, comprising a plurality of through electrodes and a first output extraction electrode, the plurality of through electrodes extending through the semiconductor substrate from the first main surface to a second main surface at the side opposite to the first main surface and being connected to the current collector electrodes, the first output extraction electrode being arranged on the second main surface and being connected to the through electrodes.

4. The solar cell element according to claim 2, wherein a thickness of the second semiconductor layer in the middle part is smaller than a thickness of the second semiconductor layer in the both end parts.

5. The solar cell element according to claim 2, wherein a maximum impurity concentration of the second semiconductor layer in the middle part is lower than a maximum impurity concentration of the second semiconductor layer in the both end parts.

6. The solar cell element according to claim 2, wherein the current collector electrodes are arranged such that the distance between neighboring ones of the current collector electrodes gradually increases from the middle part toward the both end parts.

7. The solar cell element according to claim 2, wherein a first current collector electrode group including a plurality of the current collector electrodes located in the middle part and a second current collector electrode group including a plurality of the current collector electrodes located in the both end parts are provided, an average value of the distance between neighboring ones of the current collector electrodes in the first current collector electrode group is smaller than an average value of the distance between neighboring ones of the current collector electrodes in the second current collector electrode group.

8. The solar cell element according to claim 7, wherein the number of the current collector electrodes in the first current collector electrode group is an even number.

9. A segmented solar cell element obtained by segmenting the solar cell element according to claim 1 along some of the current collector electrodes.

10. A solar cell module comprising the solar cell element according to claim 1.

11. A solar cell module comprising the segmented solar cell element according to claim 9.

12. An electronic appliance comprising the solar cell element according to claim 1.

13. An electronic appliance comprising the segmented solar cell element according to claim 9.

14. The solar cell element according to claim 1, wherein the plurality of linear current collector electrodes are respectively arranged in a linear shape and in parallel with each other.

* * * * *